United States Patent
Li et al.

(10) Patent No.: US 12,120,868 B2
(45) Date of Patent: Oct. 15, 2024

(54) SEMICONDUCTOR DEVICE WITH BURIED BIT LINE AND PREPARATION METHOD THEREOF

(71) Applicant: CHANGXIN MEMORY TECHNOLOGIES, INC., Hefei (CN)

(72) Inventors: Ran Li, Hefei (CN); Xing Jin, Hefei (CN); Ming Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 433 days.

(21) Appl. No.: 17/599,393

(22) PCT Filed: Jun. 29, 2021

(86) PCT No.: PCT/CN2021/103087
§ 371 (c)(1),
(2) Date: Sep. 28, 2021

(87) PCT Pub. No.: WO2022/100104
PCT Pub. Date: May 19, 2022

(65) Prior Publication Data
US 2023/0103902 A1 Apr. 6, 2023

(30) Foreign Application Priority Data
Nov. 12, 2020 (CN) .......................... 202011261602.4

(51) Int. Cl.
*H01L 27/108* (2006.01)
*H10B 12/00* (2023.01)

(52) U.S. Cl.
CPC ......... *H10B 12/482* (2023.02); *H10B 12/315* (2023.02); *H10B 12/488* (2023.02)

(58) Field of Classification Search
CPC .. H10B 12/482; H10B 12/315; H10B 12/488; H10B 12/34; H10B 12/30
See application file for complete search history.

(56) References Cited

U.S. PATENT DOCUMENTS

| 6,091,094 | A | * | 7/2000 | Rupp | ................... H10B 12/395 438/242 |
|---|---|---|---|---|---|
| 8,304,824 | B2 | | 11/2012 | Kim et al. | |
| 8,390,062 | B2 | | 3/2013 | Kobayashi et al. | |
| 8,786,014 | B2 | | 7/2014 | Nagai | |

(Continued)

FOREIGN PATENT DOCUMENTS

| CN | 102034824 A | 4/2011 |
|---|---|---|
| CN | 102339831 A | 2/2012 |

(Continued)

OTHER PUBLICATIONS

International Search Report cited in PCT/CN2021/103087 mailed Sep. 26, 2021, 9 pages.

*Primary Examiner* — Jarrett J Stark
(74) *Attorney, Agent, or Firm* — Syncoda LLC; Feng Ma

(57) ABSTRACT

A semiconductor device with a buried bit line and a preparation method thereof are provided. The preparation method of a semiconductor device with a buried bit line includes: providing a substrate; forming bit line trenches; forming a bit line structure in the bit line trench; and forming word line structures in the substrate. The semiconductor device with a buried bit line includes a substrate, bit line trenches, a bit line structure, and word line structures.

13 Claims, 13 Drawing Sheets

(56) References Cited

U.S. PATENT DOCUMENTS

| | | | |
|---|---|---|---|
| 9,859,284 B2 | 1/2018 | Wang | |
| 2010/0096669 A1 | 4/2010 | Popp et al. | |
| 2012/0299073 A1* | 11/2012 | Mikasa | H10B 12/053 |
| | | | 257/296 |
| 2019/0273082 A1* | 9/2019 | Wu | H10B 12/053 |
| 2020/0058668 A1* | 2/2020 | Son | H10B 43/30 |
| 2020/0286894 A1* | 9/2020 | Lin | H10B 12/0335 |
| 2023/0301070 A1* | 9/2023 | Xiao | H01L 29/1054 |
| 2023/0354586 A1* | 11/2023 | Cui | H10B 12/50 |
| 2024/0049453 A1* | 2/2024 | Shao | H10B 12/053 |
| 2024/0057312 A1* | 2/2024 | Shao | H10B 12/05 |

FOREIGN PATENT DOCUMENTS

| | | |
|---|---|---|
| CN | 102610612 A | 7/2012 |
| CN | 106992156 A | 7/2017 |
| CN | 108878424 A | 11/2018 |
| CN | 111900164 A | 11/2020 |

* cited by examiner

SEMICONDUCTOR DEVICE WITH BURIED BIT LINE AND PREPARATION METHOD THEREOF

CROSS-REFERENCE TO RELATED APPLICATIONS

The present application is a national stage entry of International Application No. PCT/CN2021/103087, filed on Jun. 29, 2021, which claims the priority to Chinese Patent Application No. 202011261602.4, titled "SEMICONDUCTOR DEVICE WITH BURIED BIT LINE AND PREPARATION METHOD THEREOF", filed with China National Intellectual Property Administration (CNIPA) on Nov. 12, 2020. The entire contents of International Application No. PCT/CN2021/103087 and Chinese Patent Application No. 202011261602.4 are incorporated herein by reference.

TECHNICAL FIELD

The present application relates to, but is not limited to, a semiconductor device with a buried bit line and a preparation method thereof.

BACKGROUND

With the continuous development of integrated circuit technologies, a feature size of a semiconductor integrated circuit device is continuously reduced. For example, as a semiconductor integrated circuit device widely used in a multi-computer system, a dynamic random access memory (DRAM) has increasingly small critical dimensions, increasing difficulty in manufacturing, increasingly complex processes, and increasingly high costs.

How to optimize the process flow to effectively improve production efficiency and reduce production and operation costs of a company has attracted increasing attention.

SUMMARY

The present application provides a preparation method of a semiconductor device with a buried bit line. The method includes: providing a substrate, and forming, in the substrate, a plurality of active regions defined an isolation structure, each of the active regions extends along a first direction; forming bit line trenches, each of the bit line trenches extends along a second direction, each of the bit line trenches sequentially passes through the active region and the isolation structure in an S-shaped trend, and the second direction forms an acute angle with the first direction; forming a bit line structure in the bit line trench, the bit line structure includes a bit line formed at a bottom of the bit line trench and an isolation layer covering the bit line; and forming word line structures in the substrate, each of the word line structures extends along a third direction and sequentially passes through the active region and the isolation structure, the third direction is perpendicular to the second direction, in the isolation structure, the bit line is located below the word line structure, and in the active region, the bit line and the word line structure are disposed at intervals.

The present application further provides a semiconductor device with a buried bit line. The device includes: a substrate, the substrate is provided with a plurality of active regions defined by an isolation structure, and each of the active regions extends along a first direction; bit line trenches, extending along a second direction, each of the bit line trenches sequentially passes through the active region and the isolation structure in an S-shaped trend, and the second direction forms an acute angle with the first direction; a bit line structure, including a bit line and an isolation layer, the bit line is formed in the bit line trench, and the isolation layer covers the bit line and fills the bit line trench; and word line structures, extending along a third direction, and sequentially passing through the active region and the isolation structure, the third direction is perpendicular to the second direction, in the isolation structure, the bit line is located below the word line structure, and in the active region, the bit line and the word line structure are disposed at intervals.

BRIEF DESCRIPTION OF THE DRAWINGS

The drawings incorporated into the specification and constituting a part of the specification illustrate the embodiments of the present application, and are used together with the descriptions to explain the principles of the embodiments of the present application. In these drawings, similar reference numerals are used to represent similar elements. The drawings in the following description are some rather than all of the embodiments of the present application. A person of ordinary skill in the art may obtain other drawings based on these drawings without creative efforts.

DETAILED DESCRIPTION

In order to make the objectives, technical solutions and advantages of the embodiments of the present application clearer, the following clearly and completely describes the technical solutions in the embodiments of the present application with reference to the accompanying drawings in the embodiments of the present application. Apparently, the described embodiments are some rather than all of the embodiments of the present application. All other embodiments obtained by a person skilled in the art based on the embodiments of the present application without creative efforts should fall within the protection scope of the present application. It should be noted that without conflict, the embodiments in the present application and features in the embodiments may be combined with each other.

A semiconductor device with a buried bit line and a preparation method thereof provided in the present application are described in detail below with reference to the accompanying drawings and specific embodiments.

Figure 1:
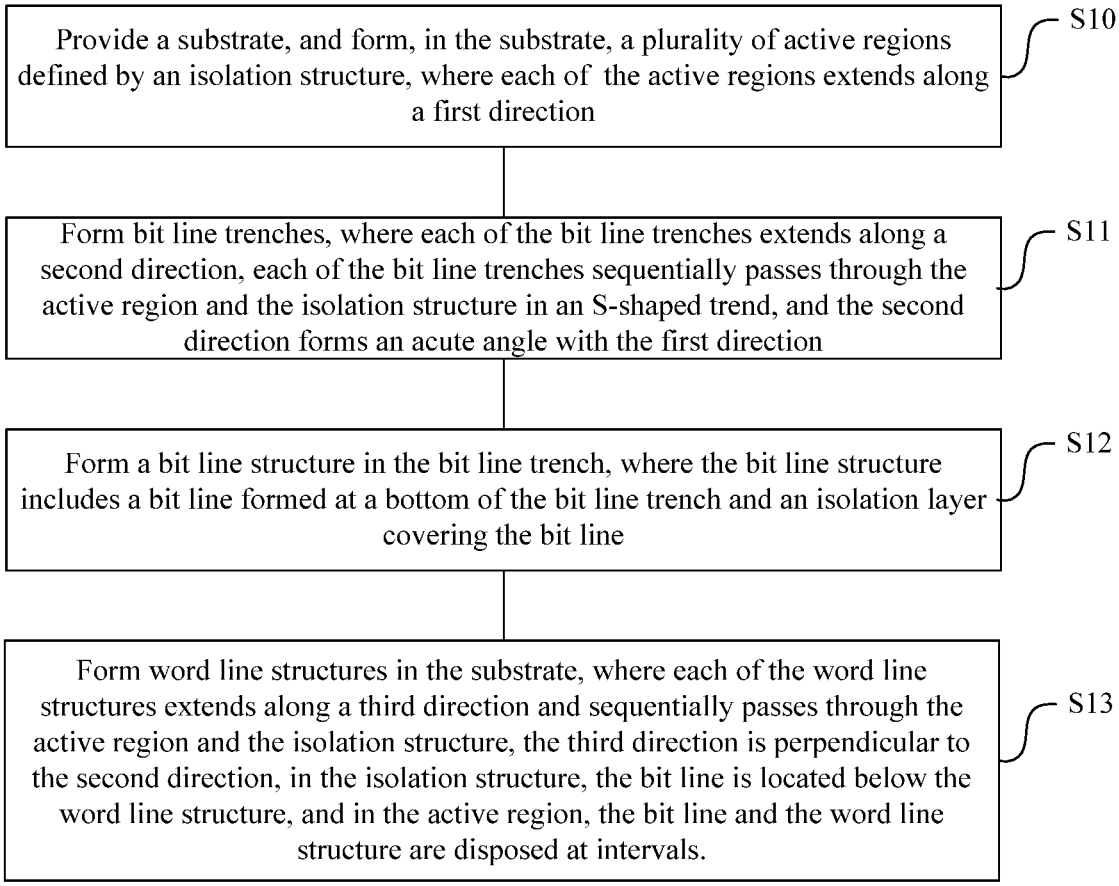
FIG. 1 is a process flowchart of a preparation method of a semiconductor device with a buried bit line according to an embodiment of the present application.

FIG. 1 is a process flowchart of a preparation method of a semiconductor device with a buried bit line according to an embodiment of the present application. Referring to FIG. 1, the preparation method of the present application includes: Step S10: Provide a substrate, and form, in the substrate, a plurality of active regions defined by an isolation structure, where each active region extends along a first direction. Step S11: Form bit line trenches, where each bit line trench extends along a second direction, each bit line trench sequentially passes through the active region and the isolation structure in an S-shaped trend, and the second direction forms an acute angle with the first direction. Step S12: Form a bit line structure in the bit line trench, where the bit line structure includes a bit line formed at the bottom of the bit line trench and an isolation layer covering the bit line. Step S13: Form a word line structure in the substrate, where the word line structure extends along a third direction and sequentially passes through the active region and the isolation structure, the third direction is perpendicular to the second direction, in the isolation structure, the bit line is located below the word line structure, and in the active region, the bit line and the word line structure are disposed at intervals.

FIG. 2A to FIG. 2M are schematic diagrams of structures formed in a preparation method of a semiconductor device with a buried bit line according to embodiments of the present application.

Step S10: Provide a substrate 200, and form, in the substrate 200, a plurality of active regions 220 defined by an isolation structure 210, where each active region 220 extends along a first direction, as shown in FIG. 2A to 2E.

The substrate 200 may be a single crystal silicon substrate, a Ge substrate, a SiGe substrate, an SOI, a GOI, or the like. A suitable semiconductor material can be selected as the substrate 200 according to an actual requirement. This is not limited herein. In this embodiment, the substrate 200 is a single crystal silicon substrate.

Each active region 220 is formed by doping the substrate 200 using a process such as plasma injection. Each active region 220 extends along the first direction (a direction B shown in FIG. 2A).

This embodiment provides by way of example a method for forming, in the substrate 200, the plurality of active regions 220 defined by the isolation structure 210.

Figure 2A:
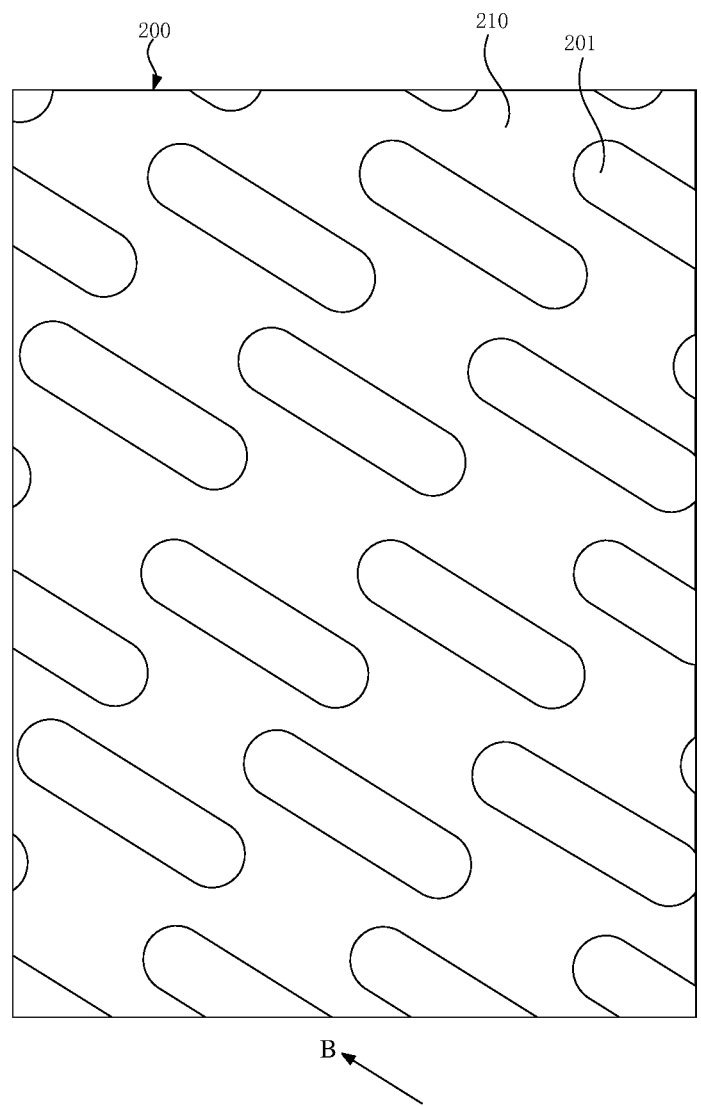
FIG. 2A to FIG. 2M are schematic diagrams of structures formed in a preparation method of a semiconductor device with a buried bit line according to embodiments of the present application.

FIG. 2A is a top view, showing that the isolation structure 210 is formed in the substrate 200, and the substrate 200 is divided into a plurality of primary regions 201 by the isolation structure 210. In this embodiment, the isolation structure 210 is a shallow trench isolation (STI). In other embodiments of the present application, the isolation structure 210 may be a structure that can perform an isolation function.

Figure 2B:
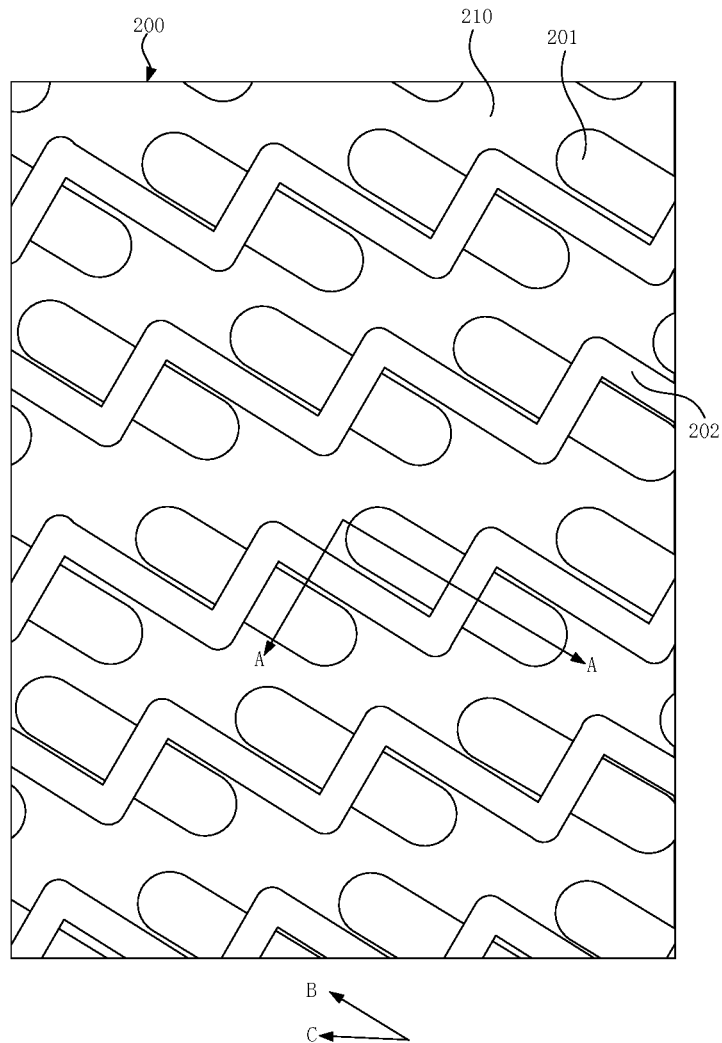
Figure 2C:
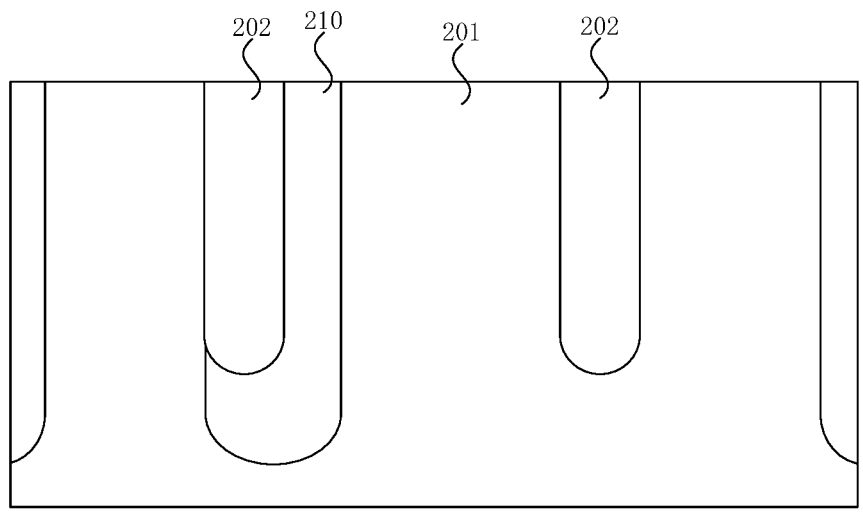

As shown in FIG. 2B and FIG. 2C, FIG. 2B is a top view, and FIG. 2C is a cross-sectional view along line A-A in FIG. 2B. Bit-line primary trenches 202 are formed in the substrate 200. Each bit-line primary trench 202 extends along a second direction. Each bit-line primary trench 202 sequentially passes through the primary region 201 and the isolation structure 210. A trend of the bit-line primary trench 202 is the same as a trend of a subsequently formed bit line trench 230 (shown in FIG. 2F).

The substrate 200 is treated by photolithography and etching processes, to form the bit-line primary trenches 202 in the substrate 200. Each bit-line primary trench 202 extends along the second direction, and sequentially passes through the primary region 201 and the isolation structure 210 in an S-shaped trend. That each bit-line primary trench 202 extends along the second direction means that an overall extension direction of each bit-line primary trench 202 is the second direction. The second direction forms an acute angle with the first direction. As shown in FIG. 2B, the second direction is a direction C, the first direction is the direction B, and the direction C forms an acute angle with the direction B. A depth by which the bit-line primary trench 202 extends into the substrate 200 is less than a depth by which the isolation structure 210 extends into the substrate 200. That is, in the substrate 200, a bottom surface of the bit-line primary trench 202 is located above a bottom surface of the isolation structure 210, to ensure that the isolation structure 210 can effectively perform an isolation function, thereby avoiding electric leakage of adjacent devices.

Figure 2D:
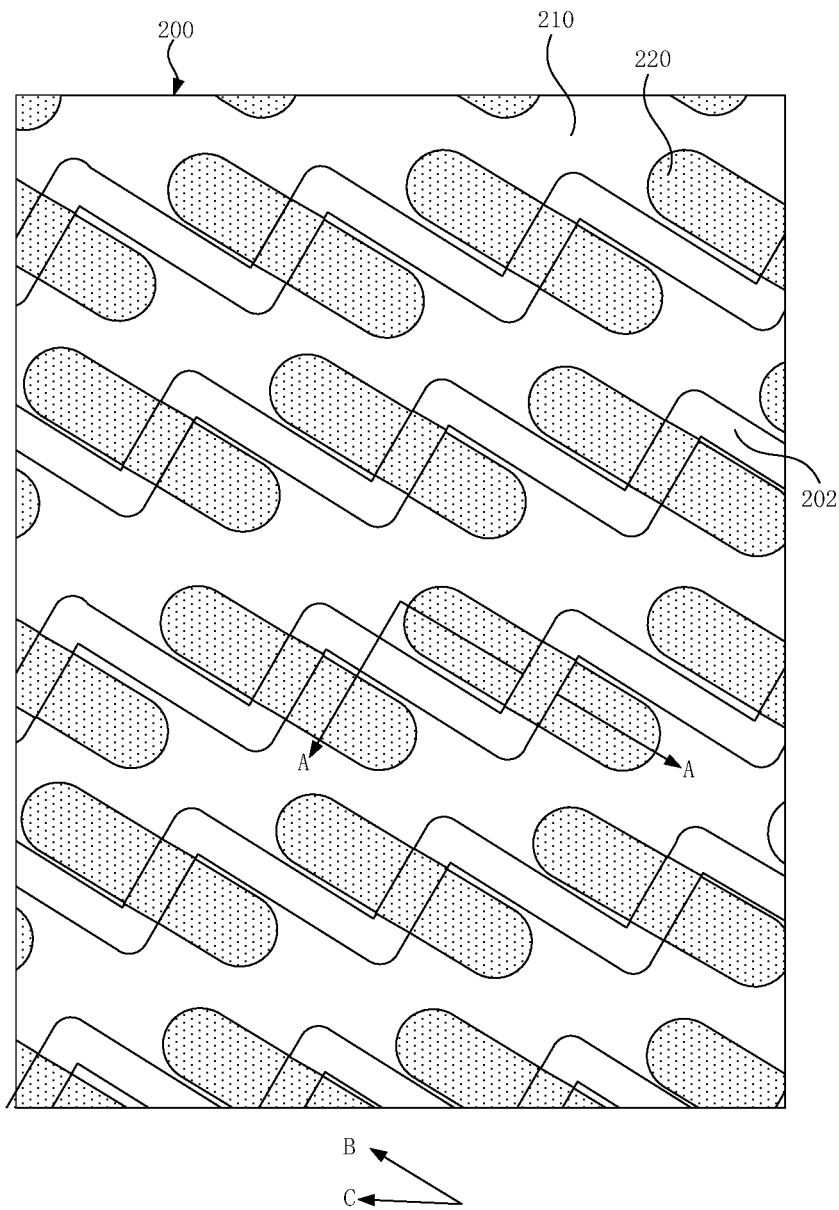
Figure 2E:
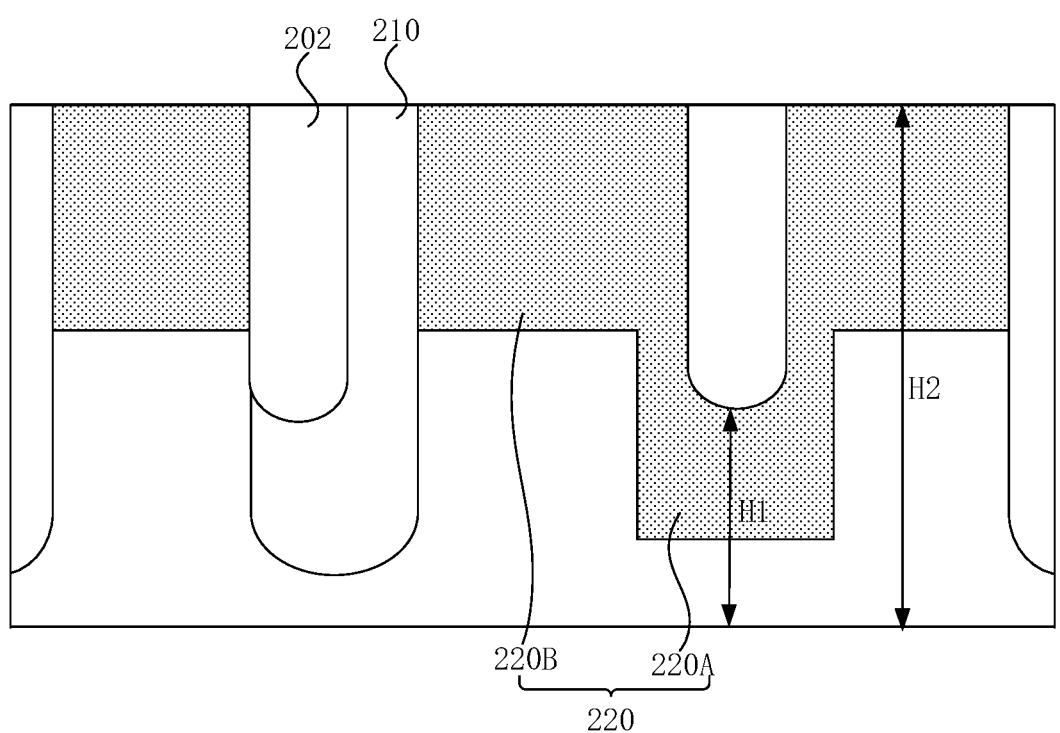

As shown in FIG. 2D and FIG. 2E, FIG. 2D is a top view, and FIG. 2E is a cross-sectional view along line A-A in FIG. 2D. Each primary region 201 is doped to form each active region 220.

Because each bit-line primary trench 202 is formed in the substrate 200, during doping of each primary region 201, a dopant is doped along an upper surface of each primary region 201 and a bottom surface and a side surface of each bit-line primary trench 202. In this case, the active region 220 forms a first doping region 220A in a region below the bit-line primary trench 202, and the active region 220 forms a second doping region 220B in a region on a side of the bit-line primary trench 202. A height of the first doping region 220A is different from a height of the second doping region 220B. The height H1 of the first doping region 220A is a distance between an upper surface of the first doping region 220A and a bottom surface of the semiconductor device. The height H2 of the second doping region 220B is a distance between an upper surface of the second doping region 220B and the bottom surface of the semiconductor device. The height H1 of the first doping region 220A is less than the height H2 of the second doping region 220B, that is, the active region 220 includes the first doping region 220A and the second doping region 220B with different surface heights.

A plasma injection process may be used to dope each primary region 201 to form each active region 220. A conductivity type of each active region 220 depends on a type of the dopant. For example, if each primary region 201 is doped with phosphorus (P), arsenic (As), or other suitable n-type dopants, the conductivity type of the active region 220 is N-type; if each primary region 201 is doped with boron (B), gallium (Ga), or other suitable p-type dopants, the conductivity type of the active region 220 is P-type. In this embodiment, because each primary region 201 is doped with an N-type dopant, the conductivity type of each active region 220 is N-type.

In this embodiment, the bit-line primary trench 202 is first formed in the substrate 200, and then the substrate 200 is doped to form each active region 220. Each active region 220 includes the first doping region 220A and the second doping region 220B with different surface heights. In other embodiments, alternatively, the bit-line primary trench 202 may not be formed. Instead, the substrate 200 is directly doped after each primary region 201 is formed, to form each active region 220 with a uniform height.

Figure 2F:
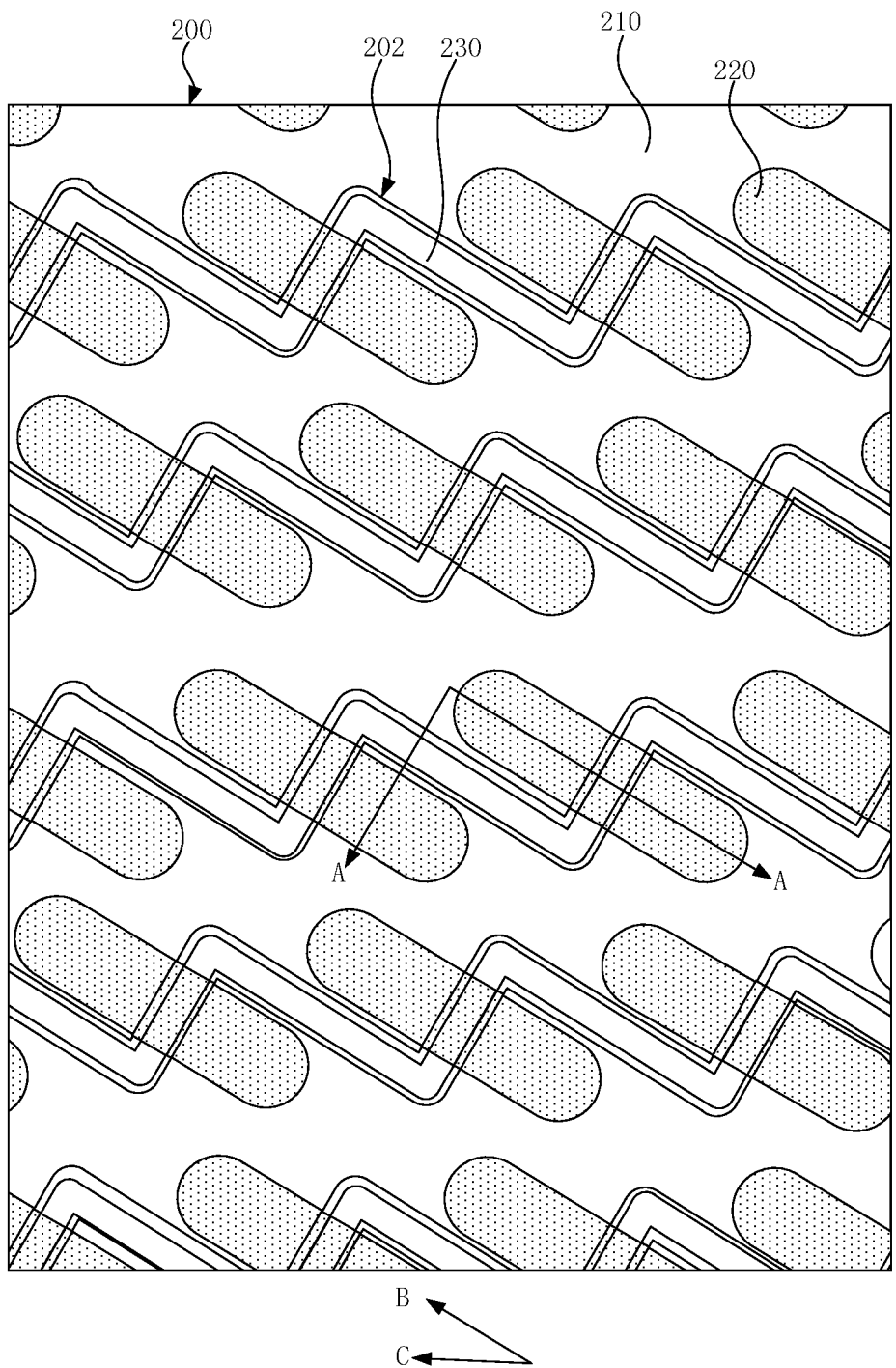
Figure 2G:
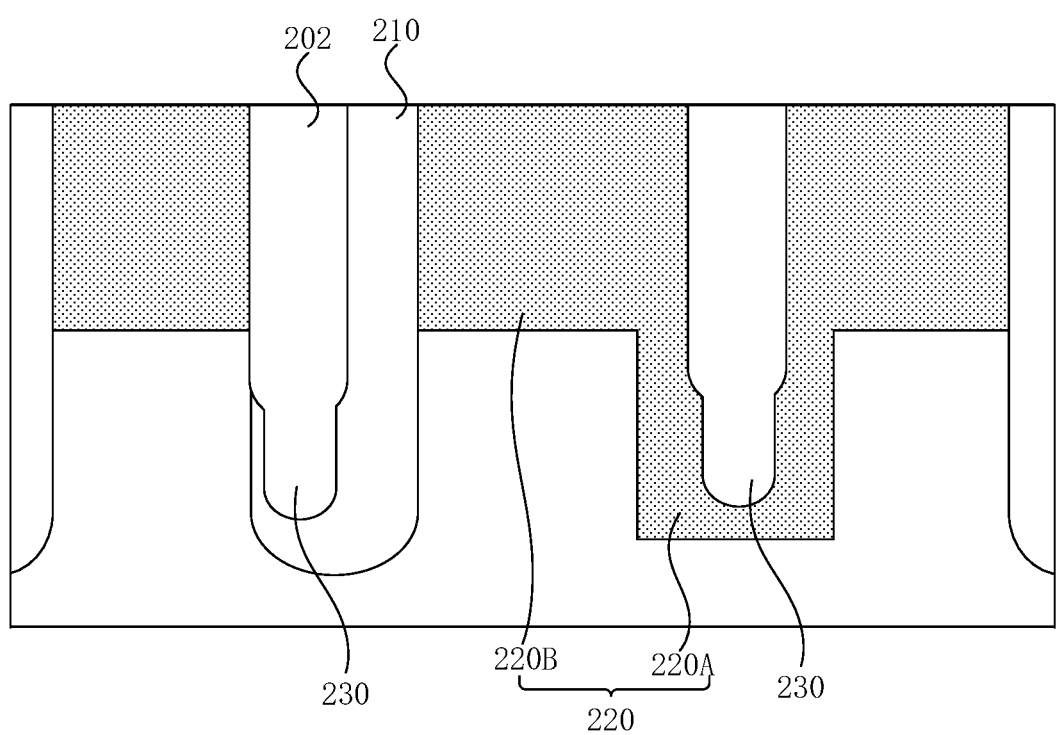

Step S11: Form bit line trenches 230, where each bit line trench 230 extends along a second direction, each bit line trench 230 sequentially passes through the active region 220 and the isolation structure 210 in an S-shaped trend, and the second direction forms an acute angle with the first direction, referring to FIG. 2F and FIG. 2G, where FIG. 2F is a top view, and FIG. 2G is a cross-sectional view along line A-A in FIG. 2F.

In step S11, photolithography and etching processes may be used to form the bit line trenches 230. In this embodiment, due to existence of each bit-line primary trench 202, each bit line trench 230 is formed at the bottom of each bit-line primary trench 202, and a width of the bit line trench 230 is less than a width of the bit-line primary trench 202. The width of the bit line trench 230 is a dimension of the bit line trench 230 parallel to a direction of the substrate 200. The width of the bit-line primary trench 202 is a dimension of the bit-line primary trench 202 parallel to the direction of the substrate 200. Whether in the isolation structure 210 or in the active region 220, the bit line trench 230 extends from the bottom of the bit-line primary trench 202 to the inside of the substrate 200.

In each active region 220, the bit line trench 230 is formed in the first doping region 220A of the active region 220, and a depth by which the bit line trench 230 extends into the substrate 200 is less than the depth by which the isolation structure 210 extends into the substrate 200. That is, in the substrate 200, a bottom surface of the bit line trench 230 is located above the bottom surface of the isolation structure 210, to ensure that the isolation structure 210 can effectively perform an isolation function, thereby avoiding electric leakage of adjacent devices. In some embodiments, a depth of the bit line trench 230 is less than a depth of the first doping region 220A, to improve performance of a subsequently formed bit line structure 240 (shown in FIG. 2I).

Figure 2H:
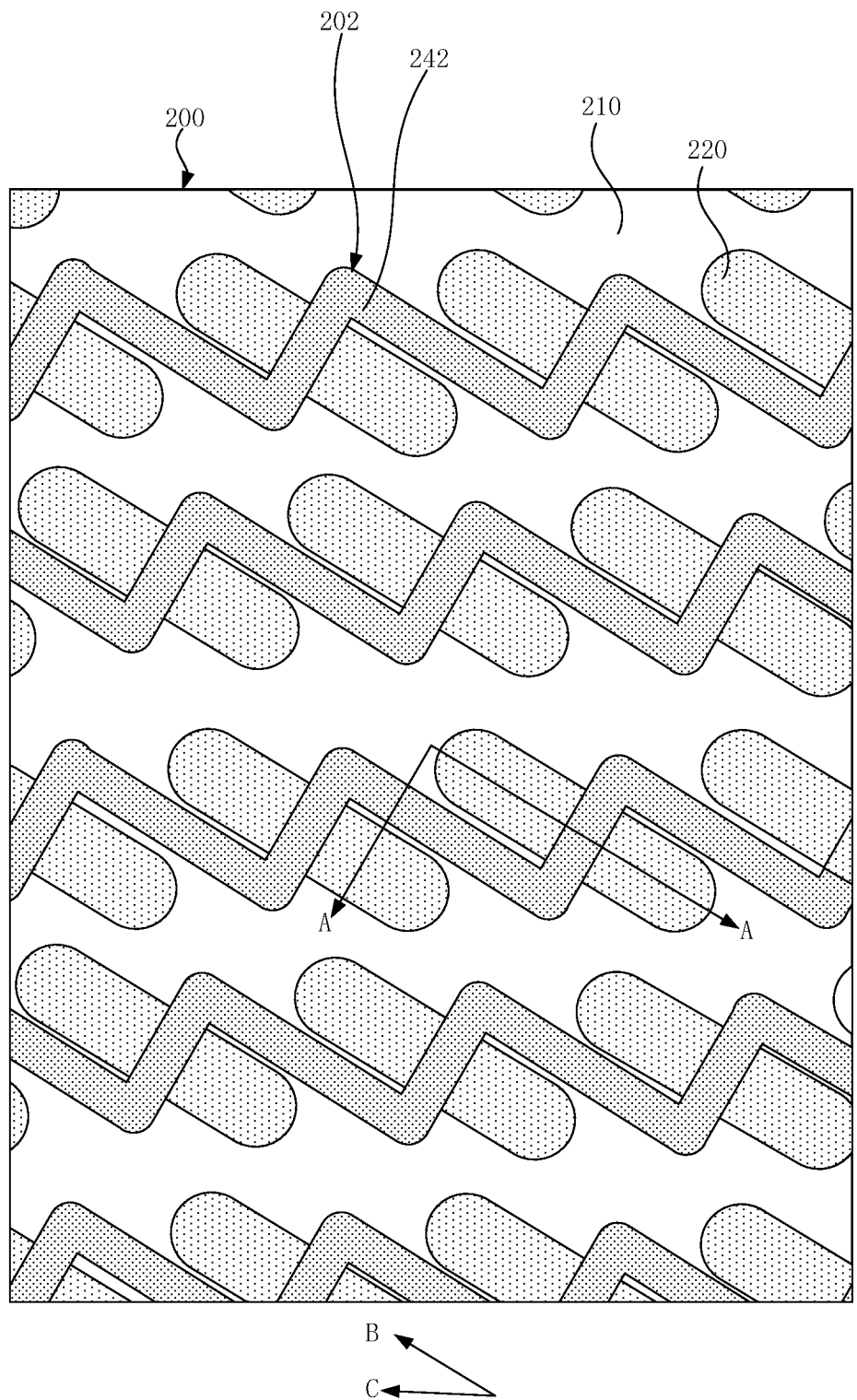
Figure 2I:
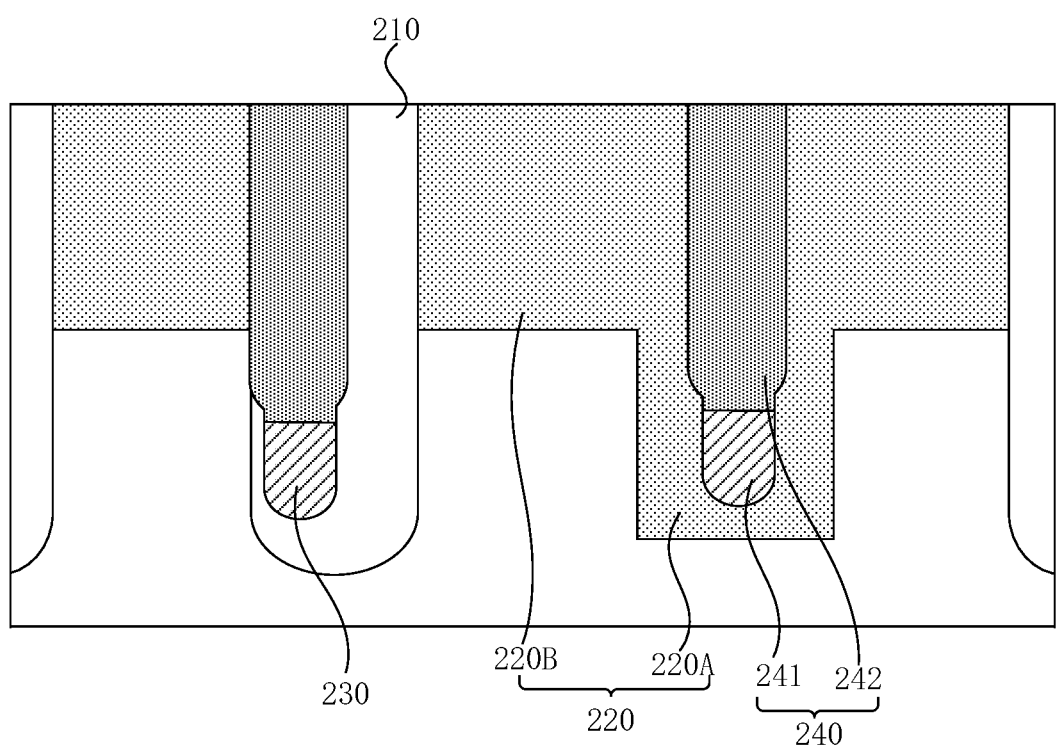

Step S12: Form a bit line structure 240 in the bit line trench 230, where the bit line structure 240 includes a bit line 241 formed at the bottom of the bit line trench 230 and an isolation layer 242 covering the bit line 241, as shown in FIG. 2H and FIG. 2I, where FIG. 2H is a top view, and FIG. 2I is a cross-sectional view along line A-A in FIG. 2H.

In step S12, the bit line 241 is deposited at the bottom of the bit line trench 230. The bit line 241 may be made of a conductive material such as tungsten. The isolation layer 242 covers the bit line 241. The isolation layer 242 may be made of a material such as oxide, for example, silicon dioxide. The isolation layer 242 protects the bit line 241. In this embodiment, the isolation layer 242 further fills the bit-line primary trench 202, and an upper surface of the isolation layer 242 is flush with an upper surface of the substrate 200, providing a basis for subsequent process steps. In step S12, a buried bit line structure is formed.

Step S13: Form word line structures 250 in the substrate 200, where each word line structure 250 extends along a third direction and sequentially passes through the active region 220 and the isolation structure 210, the third direction is perpendicular to the second direction, in the isolation structure 210, the bit line 241 is located below the word line structure 250, and in the active region 220, the bit line 241 and the word line structure 250 are disposed at intervals, as shown in FIG. 2J and FIG. 2K, where FIG. 2J is a top view, and FIG. 2K is a cross-sectional view along line A-A in FIG. 2J.

In step S13, each word line structure may be formed. For example, a self-aligned dual pattern process or a reverse self-aligned dual pattern process may be used. Each word line structure 250 consists of a multilayer structure, for example, including an insulation layer, a blocking layer, a metal layer, and a passivation layer.

Figure 2J:
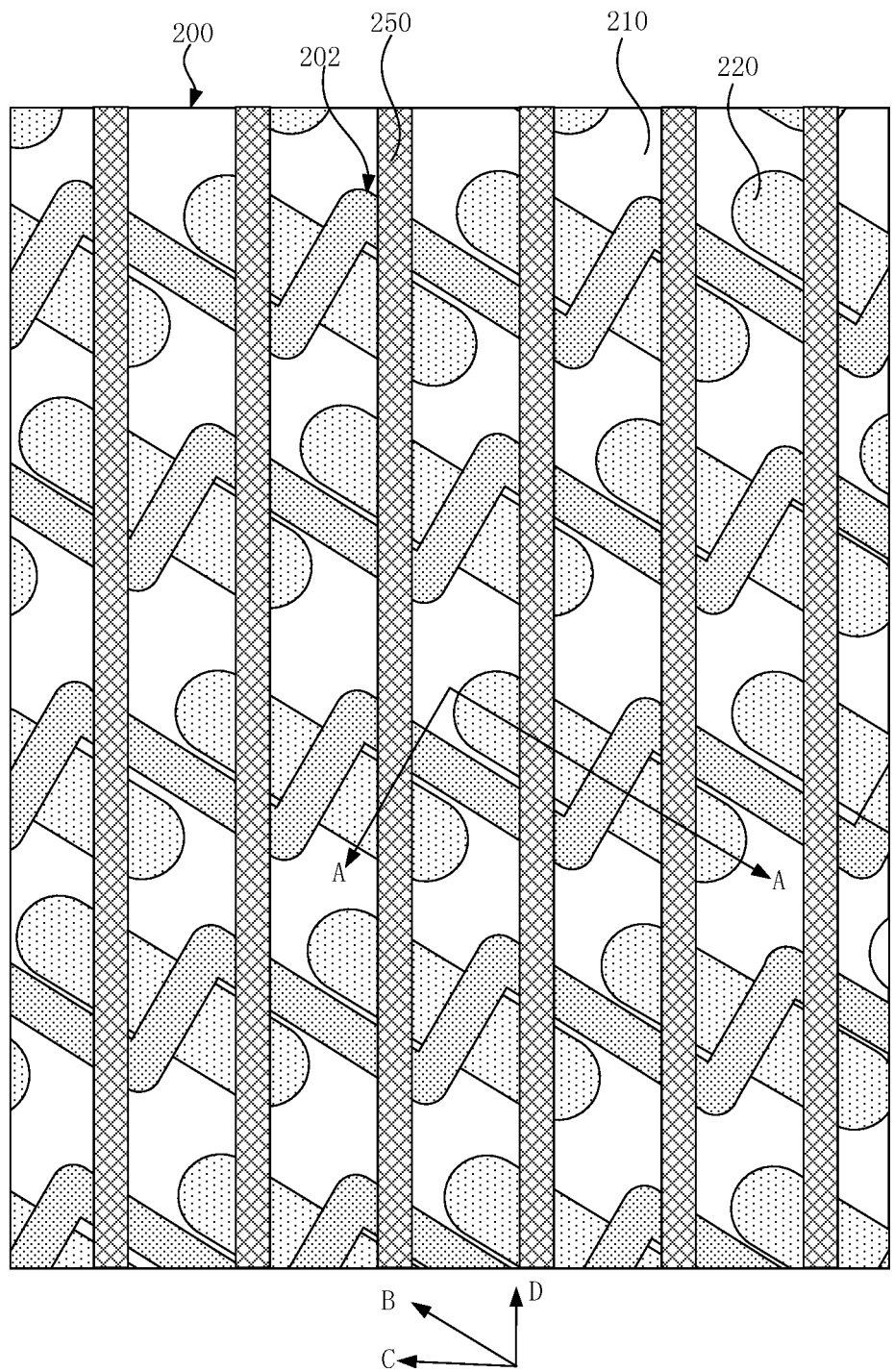
Figure 2K:
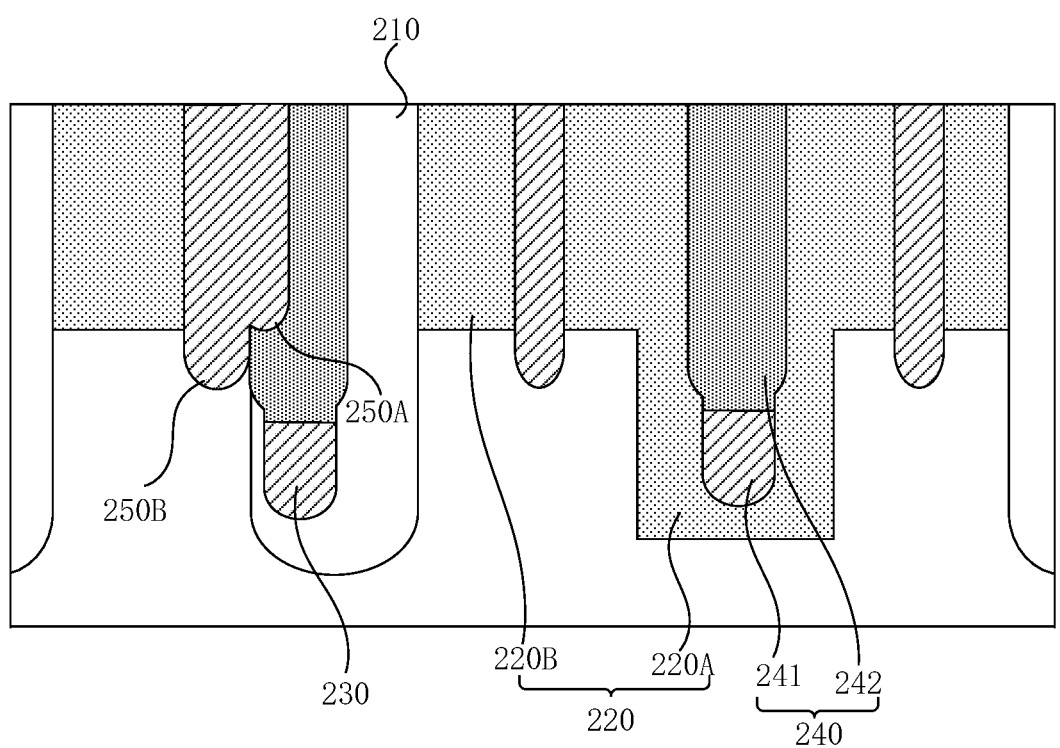

In this embodiment, each word line structure 250 extends along the third direction (a direction D shown in FIG. 2J). The third direction (the direction D) is perpendicular to the second direction (the direction C), and has an angle with the first direction (the direction B).

In the isolation structure 210, that the bit line 241 is located below the word line structure 250 refers to an up and down relationship between the two in a thickness direction of the substrate 200, and the bit line 241 is not limited to being located exactly below the word line structure 250. For example, in this embodiment, the word line structure 250 and the bit line 241 have an overlapping region in the isolation structure 210 in the thickness direction of the substrate 200, that is, the bit line 241 is located in a region below the word line structure 250. In the active region 220, the bit line 241 and the word line structure 250 are disposed at intervals, and the word line structure 250 and the bit line 241 have no overlapping region. Because in the isolation structure 210, the word line structure 250 and the bit line 241 have an overlapping region, the word line structure 250 of the present application may be disposed in such a manner that a depth by which the word line structure 250 passes through the isolation structure 210 is less than a depth by which the word line structure 250 passes through the active region 220, thereby avoiding short circuits of the word line structure 250 and the bit line 241 in the isolation structure 210. The word line structure 250 includes a first word line structure 250A passing through the isolation structure 210 and a second word line structure 250B passing through the active region 220. Specifically, referring to FIG. 2K, a depth of the first word line structure 250A in the isolation structure 210 is less than a depth of the second word line structure 250B passing through the active region 220. That the depth of the first word line structure 250A is less than the depth of the second word line structure 250B may be implemented by using the following method: during forming the trenches of the word line structures, word line structure trenches with different depths are formed in the active region 220 and the isolation structure 210 by using different etching rates of an etchant on the active region 220 and the isolation structure 210, so that the word line structures 250 formed in the word line structure trenches have different depths.

Before the step of forming the word line structures 250 in the substrate 200 (that is, before step S13), the method further includes a step of thinning the active region 220 from an upper surface of the active region 220. Specifically, the active region 220 may be polished by a chemical mechanical polishing (CMP) process, to reduce the difficulty of subsequent formation of the word line structures 250.

Figure 2L:
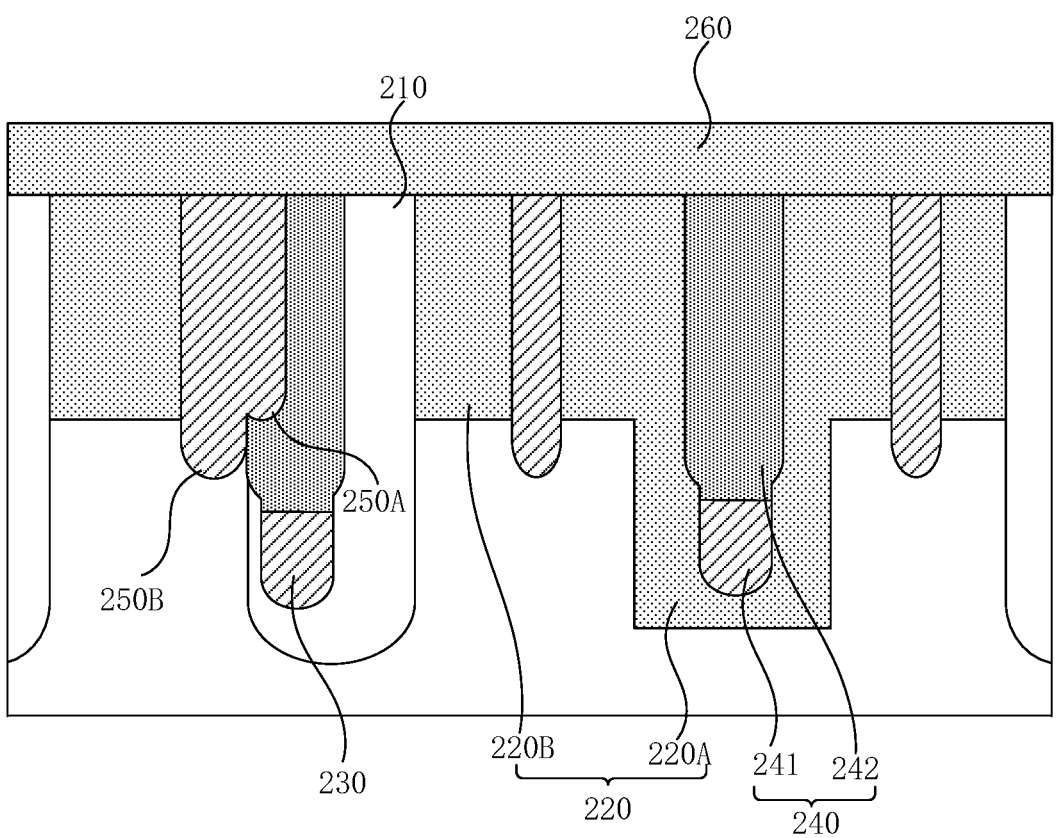

In this embodiment, after the step of forming the word line structures 250 in the substrate 200, the method further includes: as shown in FIG. 2L, forming an insulation layer 260 on a surface of the substrate 200. The insulation layer 260 protects the surface of the substrate 200 and performs an insulation function. The insulation layer 260 may be a silicon nitride layer or other insulation layers.

Figure 2M:
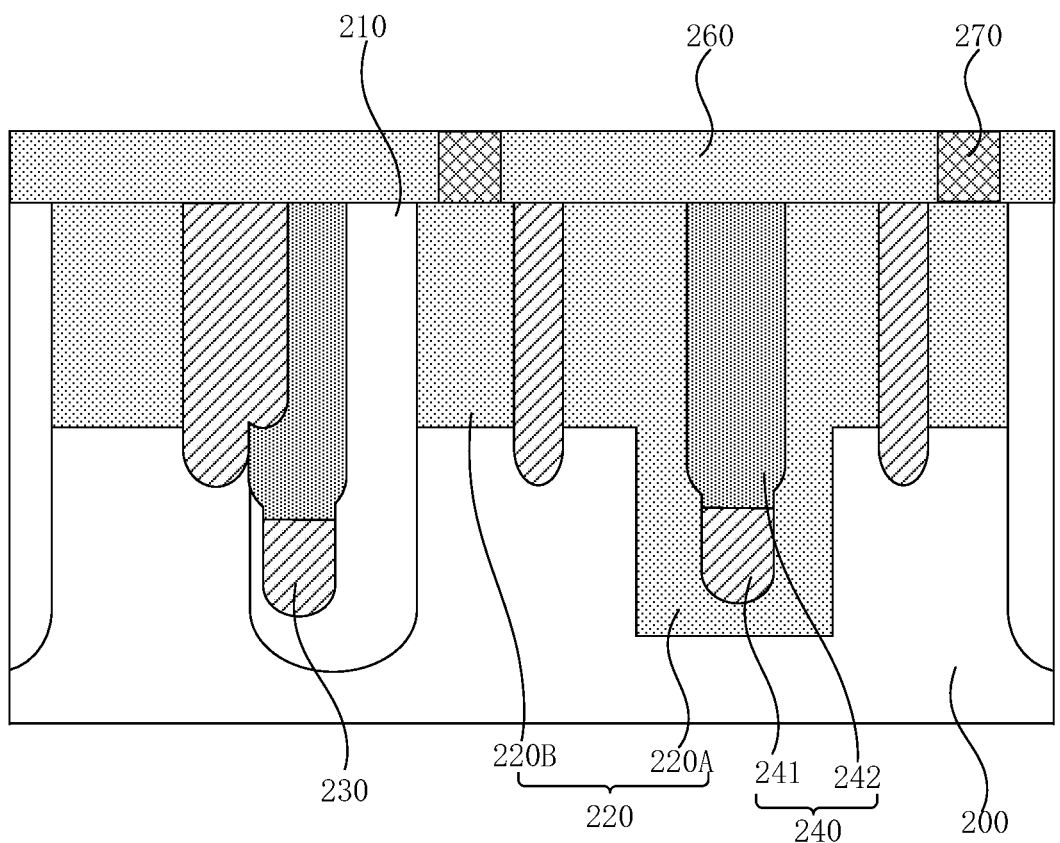

After the step of forming the insulation layer 260 on the surface of the substrate 200, the method further includes: forming capacitive contact holes, where each capacitive contact hole runs through the insulation layer 260 to the active region 220, and forming a conductive plug 270 in the capacitive contact hole, where the conductive plug 270 is in contact with the active region 220, as shown in FIG. 2M. The conductive plug 270 is configured to electrically connect a capacitor formed above the substrate 200 to the active region 220. Each capacitive contact hole may be formed directly by exposure and one-time etching through a photolithography process, and the preparation process is simple.

According to the preparation method of a semiconductor device with a buried bit line provided in the present application, an "S"-shaped buried bit line can be formed in the substrate. The buried bit line of the present application does need to be deposited on deposited insulation layers on both sides of the bit line. Therefore, a line width can be significantly reduced, and defects and yield loss caused by the collapse and distortion of the non-buried bit line can be significantly avoided. In addition, a height of a capacitive contact hole is greatly reduced because the bit line is buried in the substrate, and because the capacitive contact hole is directly formed in the insulation layer, the manufacturing process of the capacitive contact hole is greatly simplified, the process difficulty and defects of the capacitive contact hole are reduced, and a yield is effectively improved. In addition, the preparation method of the present application directly omits a manufacturing process of a BLC) pad, thereby greatly reducing manufacturing costs and process procedures. In addition, in the preparation method of the present application, an "S"-shaped buried bit line structure is skillfully constructed, making the bit line located below a word line structure, and an etching selection ratio is used so that a height difference is formed at a position where the bit line and the word line overlap, to avoid short circuits.

The present application further provides a semiconductor device with a buried bit line. Referring to FIG. 2M, in an embodiment, the semiconductor device of the present application includes a substrate 200, a bit line trench 230 (shown in FIG. 2F), a bit line structure 240, and a word line structure 250 (shown in FIG. 2J).

The substrate 200 is provided with a plurality of active regions 220 defined by an isolation structure 210. Each active region 220 extends along a first direction (a direction B shown in FIG. 2A). In this embodiment, the isolation structure 210 is a STI. In other embodiments of the present application, the isolation structure 210 may be a structure that can perform an isolation function.

In this embodiment, the substrate 200 further includes bit-line primary trenches 202. Each bit-line primary trench 202 extends along a second direction (a direction C shown in FIG. 2B), and the bit-line primary trench 202 sequentially passes through the active region 220 and the isolation structure 210.

The active region 220 includes a first doping region 220A located below the bit-line primary trench 202 and a second doping region 220B located on a side of the bit-line primary trench 202, as shown in FIG. 2E. A height of the first doping region 220A is different from a height of the second doping region 220B. The height H1 of the first doping region 220A is a distance between an upper surface of the first doping region 220A and a bottom surface of the semiconductor device. The height H2 of the second doping region 220B is a distance between an upper surface of the second doping region 220B and the bottom surface of the semiconductor device. The height H1 of the first doping region 220A is less than the height H2 of the second doping region 220B, that is, the active region 220 has an uneven surface. In the substrate 200, the bit-line primary trench 202 sequentially passes through the active region 220 and the isolation structure 210 in an "S"-shaped trend along the second direction.

In other embodiments of the present application, alternatively, the bit-line primary trench 202 may not be disposed. In this case, the surface of the active region 220 has a uniform height and doping depths are also the same.

The bit line trench 230 extends along the second direction (the direction C shown in FIG. 2F), and the bit line trench 230 sequentially passes through the active region 220 and the isolation structure 210 in the "S"-shaped trend. The second direction (the direction C shown in FIG. 2F) forms an acute angle with the first direction (the direction B shown in FIG. 2F).

In this embodiment, due to provision of the bit-line primary trench 202, the bit line trench 230 is provided at the bottom of the bit-line primary trench 202, that is, the bit line trench 230 extends from the bottom of the bit-line primary trench 202 to the inside of the substrate 200. When the bit line trench 230 is located in the active region 220, the bit line trench 230 is located within a range of the first doping region 220A of the active region 220. When the bit line trench 230 is located in the isolation structure 210, a depth by which the bit line trench 230 extends into the substrate 200 is less than a depth by which the isolation structure 210 extends into the substrate 200, that is, in the substrate 200, a bottom surface of the bit line trench 230 is disposed above a bottom surface of the isolation structure 210. Because the bit line trench 230 is provided at the bottom of the bit-line primary trench 202, a trend of the bit line trench 230 is the same as a trend of the bit-line primary trench 202, and both are in an "S" shape. A width of the bit line trench 230 is less than a width of the bit-line primary trench 202.

The bit line structure 240 includes a bit line 241 and an isolation layer 242. The bit line 241 is formed in the bit line trench 230, and the isolation layer 242 covers the bit line 241 and fills the bit line trench 230. In this embodiment, the isolation layer 242 further fills the bit-line primary trench 202. An upper surface of the isolation layer 242 is flush with an upper surface of the substrate 200.

As shown in FIG. 2J, each word line structure 250 extends along a third direction (a direction D shown in FIG. 2J) and sequentially passes through the active region 220 and the isolation structure 210. The third direction (the direction D shown in FIG. 2J) is perpendicular to the second direction (the direction C shown in FIG. 2J), and forms an angle with the first direction (the direction B shown in FIG. 2J). In the isolation structure 210, the bit line 241 is located below the word line structure 250. In the active region 220, the bit line 241 and the word line structure 250 are disposed at intervals.

The word line structure 250 consists of a multilayer structure, for example, including an insulation layer, a blocking layer, a metal layer, and a passivation layer.

The word line structure 250 and the bit line 241 have an overlapping region in the isolation structure 210 in a thickness direction of the substrate 200. In the active region 220, the word line structure 250 and the bit line 241 have no overlapping region. The word line structures 250 include a first word line structure 250A passing through the isolation structure 210 and a second word line structure 250B passing through the active region 220. A depth by which the first word line structure 250A passes through the isolation structure 210 is less than a depth by which the second word line structure 250B passes through the active region 220, to avoid short circuits of the word line structure 250 and the bit line 241 in the isolation structure 210.

As shown in FIG. 2M, the semiconductor device further includes an insulation layer 260 and conductive plugs 270.

The insulation layer 260 is disposed on a surface of the substrate 200, and covers the word line structures 250, the isolation layer 242, and the exposed active regions 220.

The insulation layer 260 has capacitive contact holes, and each capacitive contact hole runs through the insulation layer 260 to the active region 220. The conductive plug 270 is formed in the capacitive contact hole and in contact with the active region 220. The conductive plug 270 is configured to electrically connect a capacitor formed above the substrate 200 to the active region 220.

The "S"-shaped buried bit line structure used in the semiconductor device of the present application does not need to be deposited on deposited insulation layers on both sides of the bit line. Therefore, a line width can be significantly reduced, and defects and yield loss caused by the collapse and distortion of the non-buried bit line can be significantly avoided. In addition, a height of a capacitive contact hole is greatly reduced because the bit line is buried in the substrate, and because the capacitive contact hole is directly formed in the insulation layer, the manufacturing process of the capacitive contact hole is greatly simplified, the process difficulty and defects of the capacitive contact hole are reduced, and a yield is effectively improved. In addition, the semiconductor device of the present application needs to be provided with no BLC pad structure, thereby greatly reducing manufacturing costs and process procedures. In addition, the bit line of the semiconductor device of the present application is located below the word line structure, and a height difference is formed at a position where the bit line and the work line overlap, to avoid short circuits of the bit line and the word line structure, thereby greatly improving performance of the semiconductor device.

The foregoing descriptions are merely preferred implementations of the present application. It should be noted that several improvements and modifications may further be made by a person of ordinary skill in the art without departing from the principle of the present application, and such improvements and modifications should also be deemed as falling within the protection scope of the present application.

INDUSTRIAL APPLICABILITY

According to the semiconductor device with a buried bit line and the preparation method thereof provided in the present application, an "S"-shaped buried bit line structure is used in the semiconductor device, so that a line width can be significantly reduced, and defects and yield loss caused by the collapse and distortion of a non-buried bit line can be significantly avoided. In addition, a height of a capacitive contact hole is greatly reduced because the bit line is buried in the substrate, and because the capacitive contact hole is directly formed in the insulation layer, the manufacturing process of the capacitive contact hole is greatly simplified, the process difficulty and defects of the capacitive contact hole are reduced, and a yield is effectively improved. In addition, the preparation method of the semiconductor device not only reduces the manufacturing costs and process procedures but also skillfully constructs an "S"-shaped buried bit line structure to avoid short circuits.

The invention claimed is:

1. A preparation method of a semiconductor device with a buried bit line, comprising:
   providing a substrate, and forming, in the substrate, a plurality of active regions defined by an isolation structure, wherein each of the active regions extends along a first direction;
   forming bit line trenches, wherein each of the bit line trenches extends along a second direction, each of the bit line trenches sequentially passes through the active region and the isolation structure in an S-shaped trend, and the second direction forms an acute angle with the first direction;
   forming a bit line structure in each of the bit line trenches, wherein the bit line structure comprises a bit line formed at a bottom of each of the bit line trenches and an isolation layer covering the bit line; and
   forming word line structures in the substrate, wherein each of the word line structures extends along a third direction and sequentially passes through the active region and the isolation structure, the third direction is perpendicular to the second direction, in the isolation structure, the bit line is located below the word line structure, and in the active region, the bit line and the word line structure are disposed at intervals;
   wherein a depth of each of the word line structures passing through the isolation structure is less than a depth of each of the word line structures passing through the active region.

2. The preparation method of the semiconductor device with the buried bit line according to claim 1, wherein the forming, in the substrate, a plurality of active regions defined by an isolation structure comprises:
   forming the isolation structure in the substrate, wherein the substrate is divided into a plurality of primary regions by the isolation structure; and
   doping each of the primary regions to form each of the active regions.

3. The preparation method of the semiconductor device with the buried bit line according to claim 2, before the doping each of the primary regions to form each of the active regions, further comprising:
   forming bit-line primary trenches in the substrate, wherein each of the bit-line primary trenches extends along the second direction, each of the bit-line primary trenches sequentially passes through the active region and the isolation structure, and a trend of the bit-line primary trench is the same as a trend of the bit line trench; and
   doping each of the primary regions to form each of the active regions, the active region comprises a first doping region and a second doping region with different heights, wherein the first doping region is a region below the bit-line primary trench, and the second doping region is a region on a side of the bit-line primary trench.

4. The preparation method of the semiconductor device with the buried bit line according to claim 3, wherein the forming bit line trenches, each of the bit line trenches is formed at a bottom of each of the bit-line primary trenches, and a width of the bit line trench is less than a width of the bit-line primary trench.

5. The preparation method of the semiconductor device with the buried bit line according to claim 4, wherein the bit line is formed at the bottom of the bit line trench and the isolation layer covering the bit line is formed, the isolation layer further fills the bit-line primary trench.

6. The preparation method of the semiconductor device with the buried bit line according to claim 1, before the forming word line structures in the substrate, further comprising
   thinning each of the active regions from an upper surface of the active region.

7. The preparation method of the semiconductor device with the buried bit line according to claim 1, after the forming word line structures in the substrate, further comprising
   forming an insulation layer on a surface of the substrate.

8. The preparation method of the semiconductor device with the buried bit line according to claim 7, after the forming an insulation layer on a surface of the substrate, further comprising:
   forming capacitive contact holes, wherein each of the capacitive contact holes runs through the insulation layer to the active region; and
   forming a conductive plug in the capacitive contact hole, wherein the conductive plug is in contact with the active region.

9. The preparation method of the semiconductor device with the buried bit line according to claim 3, wherein a height of the first doping region is less than a height of the second doping region.

10. A semiconductor device with a buried bit line, comprising:

a substrate, wherein the substrate is provided with a plurality of active regions defined by an isolation structure, and each of the active regions extends along a first direction;

bit line trenches, extending along a second direction, wherein each of the bit line trenches sequentially passes through the active region and the isolation structure in an S-shaped trend, and the second direction forms an acute angle with the first direction;

a bit line structure, comprising a bit line and an isolation layer, wherein the bit line is formed in the each of bit line trenches, and the isolation layer covers the bit line and fills the bit line trenches; and word line structures, extending along a third direction, and sequentially passing through the active region and the isolation structure, wherein the third direction is perpendicular to the second direction, in the isolation structure, the bit line is located below the word line structures, and in the active region, the bit line and the word line structure are disposed at intervals;

wherein a depth of each of the word line structures passing through the isolation structure is less than a depth of each of the word line structures passing through the active region.

11. The semiconductor device with the buried bit line according to claim 10, wherein the substrate further comprises bit-line primary trenches, each of the bit-line primary trenches extends along the second direction, each of the bit-line primary trenches sequentially passes through the active region and the isolation structure, a trend of the bit-line primary trench is the same as a trend of the bit line trench, the active region comprises a first doping region located below the bit-line primary trench and a second doping region located on a side of the bit-line primary trench, the bit line trench is located in the first doping region, and the isolation layer further fills the bit-line primary trench.

12. A semiconductor device with a buried bit line, comprising:

a substrate, wherein the substrate is provided with a plurality of active regions defined by an isolation structure, and each of the active regions extends along a first direction;

bit line trenches, extending along a second direction, wherein each of the bit line trenches sequentially passes through the active region and the isolation structure in an S-shaped trend, and the second direction forms an acute angle with the first direction:

a bit line structure, comprising a bit line and an isolation layer, wherein the bit line is formed in the each of bit line trenches, and the isolation layer covers the bit line and fills the bit line trenches; and word line structures, extending along a third direction, and sequentially passing through the active region and the isolation structure, wherein the third direction is perpendicular to the second direction, in the isolation structure, the bit line is located below the word line structures, and in the active region, the bit line and the word line structure are disposed at intervals:

wherein a width of each of the bit line trenches is less than a width of each of the bit-line primary trenches.

13. The semiconductor device with the buried bit line according to claim 10, further comprising:

an insulation layer, disposed on a surface of the substrate, wherein the insulation layer has capacitive contact holes, and each of the capacitive contact holes runs through the insulation layer to the active region; and conductive plugs, formed in the capacitive contact holes, and being in contact with the active region.

* * * * *